US012626073B2

(12) United States Patent
Singh et al.

(10) Patent No.: US 12,626,073 B2
(45) Date of Patent: May 12, 2026

(54) HIGH-SPEED PULSE-WIDTH MODULATOR

(71) Applicant: International Business Machines Corporation, Armonk, NY (US)

(72) Inventors: Abhairaj Singh, Adliswil (CH); Kumudu Geethan Karunaratne, Adliswil (CH); Manuel Le Gallo-Bourdeau, Horgen (CH); Abu Sebastian, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 188 days.

(21) Appl. No.: 18/671,401

(22) Filed: May 22, 2024

(65) Prior Publication Data

US 2025/0363316 A1 Nov. 27, 2025

(51) Int. Cl.
| | |
|---|---|
| *G06G 7/161* | (2006.01) |
| *H03M 1/12* | (2006.01) |
| *H03M 1/66* | (2006.01) |

(52) U.S. Cl.
CPC .............. *G06G 7/161* (2013.01); *H03M 1/12* (2013.01); *H03M 1/66* (2013.01)

(58) Field of Classification Search
CPC ........... H03M 1/12; H03M 1/66; G06G 7/161
See application file for complete search history.

(56) References Cited

U.S. PATENT DOCUMENTS

| | | | | |
|---|---|---|---|---|
| 9,742,421 | B2 * | 8/2017 | Zhu | H03M 1/08 |
| 10,216,703 | B2 * | 2/2019 | Gupta | G06F 17/16 |
| 10,425,095 | B1 * | 9/2019 | Price | H03M 1/365 |
| 10,496,374 | B2 * | 12/2019 | Hu | G11C 7/1006 |

(Continued)

FOREIGN PATENT DOCUMENTS

| | | |
|---|---|---|
| CN | 113268220 A | 8/2021 |
| CN | 113870918 A | 12/2021 |

(Continued)

OTHER PUBLICATIONS

Hong, S., et al., "Low Voltage Time-Based Matrix Multiplier-and-Accumulator for Neural Computing System", Electronics 2020, Received Oct. 26, 2020, Accepted Dec. 11, 2020, Published Dec. 14, 2020, 12 pages.

(Continued)

*Primary Examiner* — Lam T Mai
(74) *Attorney, Agent, or Firm* — Scully, Scott, Murphy & Presser, P.C.; Kimberly S. Zillig

(57) ABSTRACT

Input digital bits are split into a first part and a second part. Digital-to-analog converter (DAC) is configured to encode the first part and the second part into analog form as an activation pulse having width equivalent to magnitude of the first part in time units and a delay of a duration that is a fraction of one time unit of the time units, where the fraction is equivalent to magnitude of the second part divided by two raised to power of number of bits in the second part. Crossbar array coupled with the DAC stores weights encoded as analog conductance on resistive memory devices, and is configured to generate analog computation output responsive to the analog form of the input digital bits applied to the crossbar array. Analog-to-digital converter (ADC) coupled with the crossbar array, is configured to digitize the analog computation output from the crossbar array.

20 Claims, 11 Drawing Sheets

(56) References Cited

U.S. PATENT DOCUMENTS

| | | | |
|---|---|---|---|
| 11,251,370 B1 * | 2/2022 | Syed | H10N 70/8833 |
| 2018/0004708 A1 * | 1/2018 | Muralimanohar | G06F 17/16 |
| 2019/0103879 A1 * | 4/2019 | Kinyua | H03M 1/145 |
| 2020/0279012 A1 * | 9/2020 | Khaddam-Aljameh | |
| | | | G06G 7/22 |
| 2020/0334523 A1 * | 10/2020 | Kumar | G11C 11/54 |
| 2020/0411091 A1 * | 12/2020 | Hwang | G11C 13/004 |
| 2022/0148655 A1 * | 5/2022 | Syed | G11C 11/5678 |
| 2023/0176606 A1 * | 6/2023 | Syed | G06F 17/11 |
| | | | 708/191 |
| 2023/0419093 A1 * | 12/2023 | Narayanan | G06F 7/582 |
| 2024/0420762 A1 * | 12/2024 | Kersting | G11C 13/0026 |
| 2025/0342226 A1 * | 11/2025 | Saito | G06F 3/0673 |

FOREIGN PATENT DOCUMENTS

| | | |
|---|---|---|
| CN | 116594954 A | 8/2023 |
| CN | 116719504 A | 9/2023 |

OTHER PUBLICATIONS

Jain, S., et al., "CIM SRAM for Signed In-Memory Broad-Purpose Computing From DSP to Neural Processing", IEEE Journal of Solid-State Circuits, Oct. 2021, vol. 56, No. 10.

Jiang, H., et al., "MINT: Mixed-precision RRAM-based IN-memory Training Architecture", 2020 IEEE International Symposium on Circuits and Systems (ISCAS), Sep. 28, 2020, 5 pages.

Khaddam-Aljameh, R., et al., "HERMES-Core—A 1.59-TOPS/mm2 PCM on 14-nm CMOS In-Memory Compute Core Using 300-ps/LSB Linearized CCO-Based ADCs", IEEE Journal of Solid-State Circuits, Apr. 2022, pp. 1027-1038, vol. 57, No. 4.

Kong, Y., et al., "A time-domain compute-in-memory architecture based on pulse width modulation for multi-bits convolutional neural networks", Authorea, Jan. 13, 2023, 4 pages.

Le Gallo, M., et al., A 64-core mixed-signal in-memory compute chip based on phase-change memory for deep neural network inference, arXiv:2212.02872v1 [cs.ET], Dec. 6, 2022, 25 pages.

Papistas, I.A., et al., "AA 22 nm, 1540 TOP/s/W, 12.1 TOP/s/mm2 in-Memory Analog Matrix-Vector-Multiplier for DNN Acceleration", AIEEE CICC 2021, Session 2: Photonics, Sensing and Machine Learning, Paper 2-6, Apr. 2021, pp. 1-2.

Zhang, K., et al., "A Novel 9T1C-SRAM Compute-In-Memory Macro With Count-Less Pulse-Width Modulation Input and ADC-Less Charge-Integration-Count Output", IEEE Transactions on Circuits and Systems—I: Regular Papers, Oct. 2023, pp. 3944-3953, vol. 70, No. 10.

Zhang, S., et al., "A Pulse-width Modulation Neuron with Continuous Activation for Processing-In-Memory Engines", Design, Automation and Test in Europe (Date 2020), Mar. 2020, pp. 1426-1438.

* cited by examiner

HIGH-SPEED PULSE-WIDTH MODULATOR

BACKGROUND

The present application relates generally to computers and computer applications, and more particularly to pulse-width modulators. Such pulse-width modulators can be used in performing in-memory matrix multiplications.

BRIEF SUMMARY

The summary of the disclosure is given to aid understanding of a computer system and method of high-speed pulse-width modulator, e.g., to perform in-memory matrix multiplication, and not with an intent to limit the disclosure or the invention. It should be understood that various aspects and features of the disclosure may advantageously be used separately in some instances, or in combination with other aspects and features of the disclosure in other instances. Accordingly, variations and modifications may be made to the computer system and/or their method of operation to achieve different effects.

In some embodiments, a device includes a processor configured to split input digital bits into a first part and a second part. The device also include a digital-to-analog converter (DAC) coupled with the processor. The DAC is configured to encode the first part and the second part into analog form as an activation pulse having width equivalent to magnitude of the first part in time units and a delay of a duration that is a fraction of one time unit of the time units. The fraction is equivalent to magnitude of the second part divided by two raised to power of number of bits in the second part. The device also includes a crossbar array coupled with the DAC. The crossbar array is structured with resistive memory devices. The crossbar array is also configured to store weights, where each of the weights is encoded as analog conductance using at least one of the resistive memory devices. The crossbar array is also configured to generate analog computation output responsive to the analog form of the input digital bits applied to the crossbar array. The device also includes an analog-to-digital converter (ADC) coupled with the crossbar array. The ADC is configured to digitize the analog computation output from the crossbar array.

In some embodiments, a method includes splitting input digital bits into a first part and a second part. The method also include encoding, by a digital-to-analog converter (DAC), the first part and the second part into analog form as an activation pulse having width equivalent to magnitude of the first part in time units and a delay of a duration that is a fraction of one time unit of the time units. The fraction is equivalent to magnitude of the second part divided by two raised to power of number of bits in the second part. The method also includes generating, by a crossbar array storing weights as analog conductance on resistive memory devices, analog computation output, responsive to the analog form of the input digital bits applied to the crossbar array. The method also includes digitizing, by an analog-to-digital converter (ADC), the analog computation output from the crossbar array.

Further features as well as the structure and operation of various embodiments are described in detail below with reference to the accompanying drawings. In the drawings, like reference numbers indicate identical or functionally similar elements.

DETAILED DESCRIPTION

Figure 1:
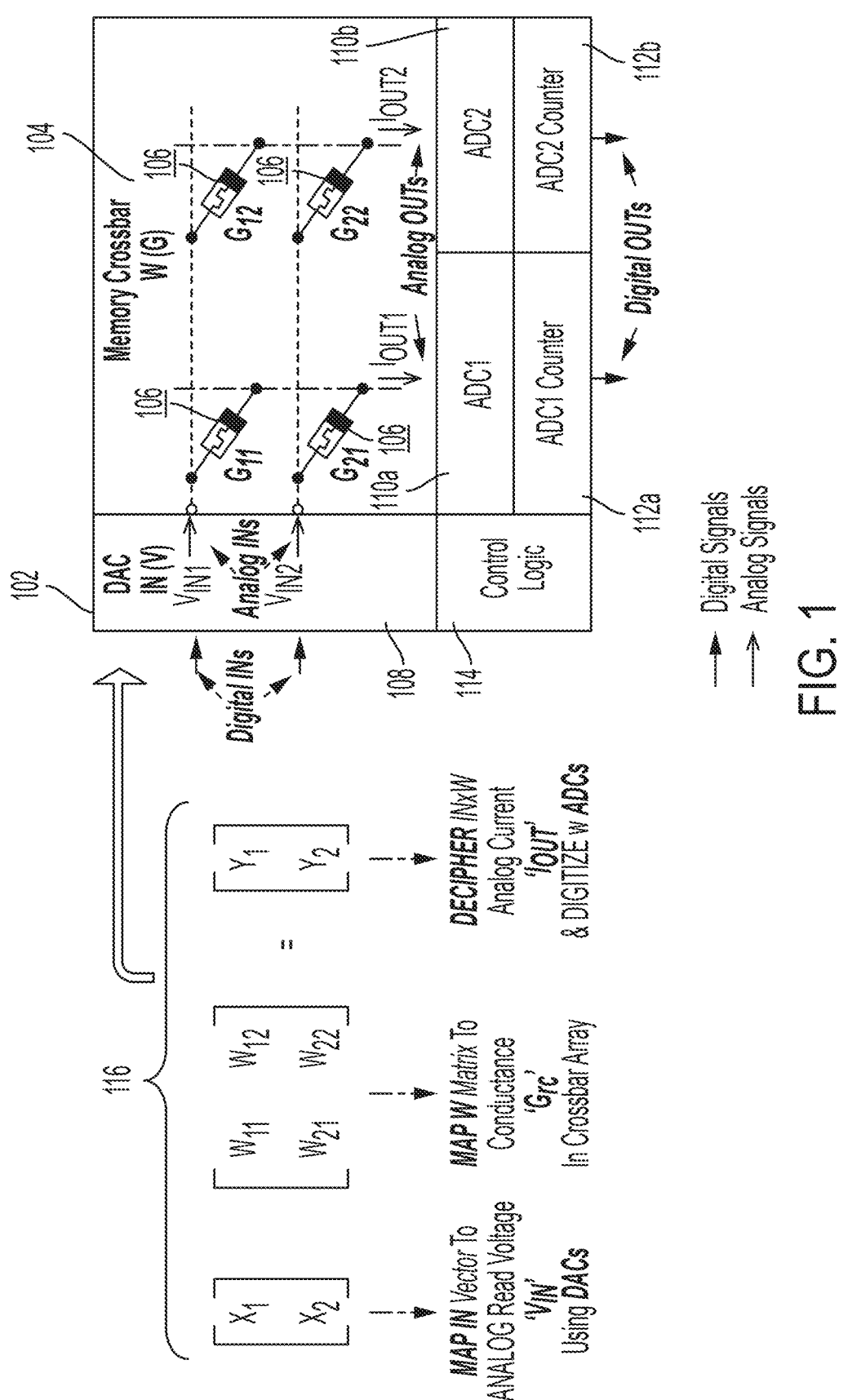
FIG. 1 illustrates an example of a device that performs analog matrix-vector multiplication (MVM) in some embodiments.

FIG. 1 illustrates an example of a device that performs analog matrix-vector multiplication (MVM) in some embodiments. Such a device can be used in neural network implementations, such as for deep neural network implementations, where the MVM performs Multiplication and Accumulation (MAC) of input and weight vectors.

Device 102 for performing MVM is arranged in a crossbar configuration, also referred to as a crossbar array 104. Memory elements 106 can be arranged at cross points of the crossbar array 106. At each cross point or junction in the crossbar structure or crossbar array, there can be at least one memory element 106, examples of which can include but are not limited to, an analog memory element such as resistive RAM (ReRAM), conductive-bridging RAM (CBRAM), NOR flash, magnetic RAM (MRAM), and phase-change memory (PCM). Such memory elements can be programmed to store matrix values (e.g., which can correspond to synaptic weight values of an artificial neural network (ANN) for neural network implementation) in MVM. In some embodiments, there can be two or more memory elements at each cross point. For example, a signed weight can be represented with two elements, one dedicated to each sign. Depending on the sign of the weight, weight is stored in analog format with conductance into one of the two memory elements, while the other is kept at zero (or near zero) conductance.

The device 102 also includes digital-to-analog converter (DAC) 108 that converts input digital data to analog signals for feeding into the crossbar array 104. There can be multiple DACs at 108 corresponding to multiple inputs lines. The device 102 also includes analog-to-digital converters (ADCs) 110a, 110b, which converts currents produced in each column of the crossbar array 104 to digital data. The device 102 can also include ADC counters as shown at 112a and 112b. Control logic 114 may perform pre-processing and/or post-processing operations for the functioning of the device 102. For simplicity, two rows and two columns are shown. However, a crossbar array can have any number of rows and columns, e.g., depending on the size of the matrix and vector in matrix-vector-multiplication. The device 102 is also referred to as a resistive memory device.

For performing an MVM operation, e.g., Ax=b, where A is a matrix and x is a vector, A is mapped to the conductance values of devices such as shown at 102. The x value is linearly mapped to the read voltage values. In some embodiments, input can also be mapped to currents. The resulting current along each column is proportional to the result, b. Properties of the device 102 include analog storage capability and usage of Kirchhoff's circuit laws (Ohms law and Kirchhoff's current law). Another example of a computational primitive that can be performed using the device 102 is a multiplication with the transpose of the input vector or vector, which can be achieved by reversing the process, e.g., applying the read voltage along the columns and measuring the current along the rows. Hence, the device 102 can be used for a range of applications such as deep learning inference and training, edge-artificial intelligence (AI), solvers for systems of linear equations, and/or others.

By way of example, MVM shown at 116 can be performed by mapping W matrix to conductance '$G_{rc}$' in crossbar array 104, mapping IN (input) vector to analog read voltage '$V_{in}$' using DACs 108, and deciphering IN×W analog current '$I_{out}$' and digitizing the current using ADCs 110a, 110b, where IN represents input vector and W represents matrix of weights. In some embodiments, digitizing can also be performed using ADC counters 112a, 112b.

For example, to perform the matrix-vector multiplication XW=y (e.g., as shown at 116), the elements of matrix W (e.g., $w_{ij}$), can be mapped linearly to the conductance values of memory elements 106 (e.g., $G_{rc}$) of crossbar array 104. Memory elements 106 are memory-based unit-cells organized in a crossbar configuration. The values of the input vector x can be mapped linearly to the amplitudes (or durations) of read voltages, applied to the crossbar along the rows. The rows are also referred to as Word-Lines (WLs). The resulting current (charge) measured along the columns of the crossbar array 104, are proportional to the result of the computation, y. More specifically, the MVM operation can be achieved in the following way: An input voltage vector, V, is applied across the memory elements 106, having conductances, $G_{rc}$. Following Ohm's law and Kirchhoff law, this produces a currents $I_{out}$ in each column equal to $\Sigma_i(V_i \times G_{rc})$. In this way, the device 102 performs the function of "multiply" of the input voltage times the conductance and "accumulate" by summing up the products which are currents.

Figure 2:
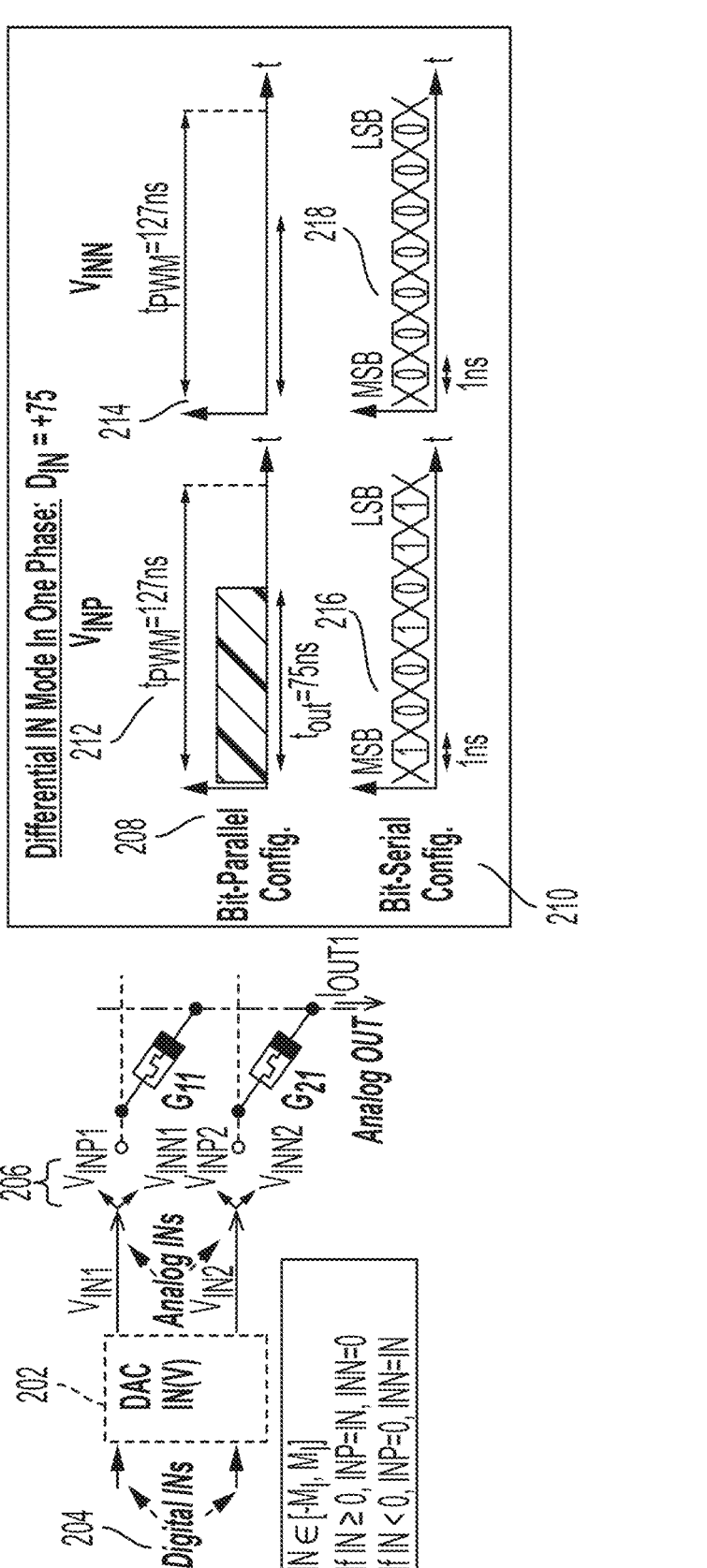
FIG. 2 illustrates a digital-to-analog converter in some embodiments.

In some embodiments, the device 102 implements in DAC 108, input vector mapping in analog in-memory computing (AIMC), i.e., changing digital inputs to analog inputs, which can speed-up MVM operation and/or other primitive operation performances. FIG. 2 illustrates a digital-to-analog converter in some embodiments.

Generally, digital inputs are signed 8 bit values, for example, positive or negative numbers. A DAC 202 maps each digital input (e.g., shown at 204) into two parts, positive ($V_{INP}$) and negative ($V_{IN}$) in analog form (e.g., shown at 206). Digital inputs can be represented in bit-parallel configuration/scheme 208 or bit-serial configuration/scheme 210. In bit-parallel scheme 208, all input bits are provided at the same time in parallel. This can be done by using a duration pulse where the duration of the pulse represents the input value. For example, for a digital input value of '+75', the positive part ($V_{INP}$) 212 of the input is activated (the negative part 214 not being activated). The magnitude of the positive part ($V_{INP}$) is 75, i.e., the duration of the pulse (pulse width) that represents '+75' is 75 nanoseconds (ns) as shown at 212. In this scenario, the positive sign of the input is handled as only the positive part is activated. In bit-serial scheme 210, bits are represented one at a time over several cycles, e.g., segregate the operation in several cycles, each cycle represents one bit. For example, there can be 7 cycles for 7 bits of digital input (without the signed bit) 216, each cycle representing a bit in the series of 7 bits of input. Signed bit is handled by activating either the positive part 216 or negative part 218 for representing the digital input in analog form.

The input (IN) activation can be represented in several ways, e.g., amplitude of $V_{IN}$ is either VDD or GND. Bit-parallel configuration can be implemented as follows. Using pulse-width modulation (PWM), the memory cells are enabled for a duration proportional to IN magnitude and the unit delay is dependent on the IN bits. Unit delay is generally one CLK period of the external CLK available. Bit-serial configuration can be implemented as follows. This is a multi-cycle read, each with a unit delay duration, where the maximum number of pulse cycles is determined by the IN bits. Each cycle has a $V_{IN}$ value of $V_{DD}$ and GND for data bit 1 and 0, respectively.

Figure 3:
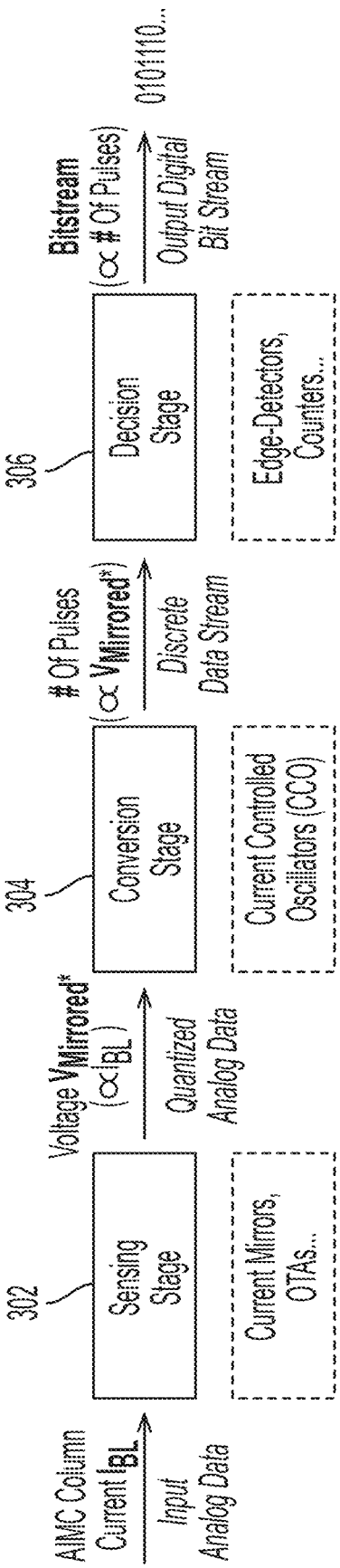
FIG. 3 illustrates an analog to digital converter in some embodiments.

Analog to digital converters (ADCs), e.g., shown in 110a and 110b convert the output current from MVM operation performed in the crossbar array 104 to digital data. Converted data then can be used in communicating with different tiles (crossbar arrays), for additional processing, computation, and/or others. FIG. 3 illustrates an analog to digital converter (e.g., shown in 110a and 110b in FIG. 1) in some embodiments.

ADCs (FIG. 1, 110a, 110b), which may also include ADC counters (FIG. 1, 110a, 110b, 112a, 112b) in an analog in-memory computing device such as the device shown in FIG. 1 at 102, are also referred to as an ADC block. The ADC block usually dominates the computational efficiency and accuracy of the AIMC (Analog In-Memory Computing).

While the memory core (e.g., crossbar array) of the AIMC performs analog-based computing and produces MVM results in analog domain, ADC facilitates the conversion of these analog MVM outputs into digital domain to enable inter-tile communication. An ADC can include three stages, where each stage ensures linear input/output (I/O) characteristics (linear relation between ideal MVM value and its corresponding digital ADC output). In sensing stage 302, an ADC changes the output current (input to the sensing stage of the ADC) into a voltage value equivalent to the input current. This sub-block 302 ensures linear value reaching the ADC as analog input ($I_{BL}$) is equivalent to the analog MVM value. In current-based ADCs, this sub-block 302 includes current mirrors, operational transconductance amplifiers (OTAs), or others, and provides intermediate analog workable conversion to the next stage.

Conversion stage 304 of an ADC converts the intermediate analog value to discrete quantities that is then fed into the last stage. For example, the voltage value from the sensing stage 302 is provided to a current-controlled oscillator (CCO), which oscillates according to the voltage value.

If the voltage value is high, the CCO oscillates at higher speed, and therefore, more pulses are present. Conversion stage 304 also includes compensation blocks to address any non-linearities of this block. In current-based ADCs, this sub-block 304 includes current-controlled oscillator (CCO) which receives the mirrored current from the sensing stage 302 and generates spikes or pulses equivalent to $I_{BL}$. Decision stage 306 of an ADC counts the number of pulses generated by the CCO as digital outputs.

For operand size greater than the size of the AIMC tile, multiple tiles (with their dedicated ADCs) produce digital outputs, and are added in local post-processing units. Different gain and offset parameters are applied (affine scaling) before this addition operation.

Figure 4:
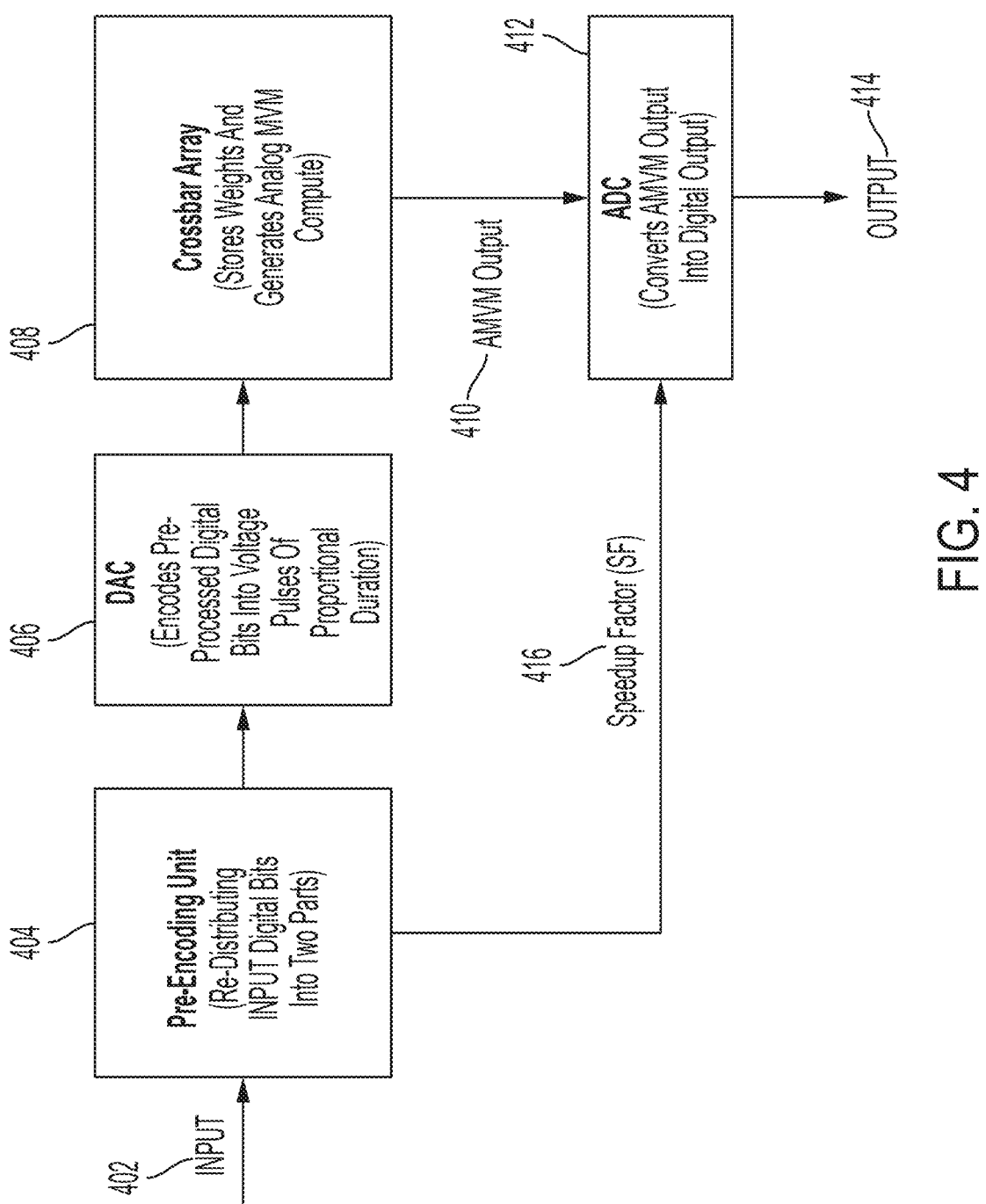
FIG. 4 is a block diagram illustrating a process flow in components of a device or system in some embodiments.

In some embodiments, systems and methods disclosed herein increase the speed of bit parallel scheme and also reduce the total integration time of MVM. FIG. 4 is a block diagram illustrating a process flow in components of a device or system in some embodiments. The process flow and the components implement a bit-parallel method to convert digital input bits into analog domain for matrix-vector-multiplication (MVM). Input 402 is received at a pre-encoding unit 404, which can be a processor (e.g., a light-weight processor). In some embodiments, this processor can be realized using a series of flip flops (FFs) followed by dedicated multiplexers (MUXs). Eight FFs store the 8-bit input values, say IN<0:7> and the selector input, say SEL<0:6> of the seven corresponding MUXs determine the division of the magnitude bits IN<0:6> into either INTEGRAL part or FRACTIONAL part. The MSB of input bit IN<7> decides whether it is a positive input or a negative input. The magnitude selector inputs SEL<0:6> determines this division as decided by the designer at run-time. For instance, a speed up of "8" implies the two group comprises of four MSB bits (INTEGRAL part) and three LSB bits (FRACTIONAL part), which can be achieved by setting SEL<0:6> as 1110000. Here, SEL bit 0 implies that IN bit will be treated as an INTEGRAL bit and SEL bit 1 implies that IN bit will be treated as a FRACTIONAL bit. Input 402 is digital data, e.g., digital bits such as 8 bits of data. The pre-encoding unit 404 re-distributes or divides the input 402 (e.g., input bits) into two parts (e.g., referred to as a first part and a second part). The pre-encoding unit 404 slices the input bits into two parts depending on a speedup factor 416. The terms speedup and speed-up are used interchangeably herein. The speedup factor 416 can be configured, for example, by a user. There may be a default speedup factor, which also can be changed by a user. Based on the speedup factor 416, the number of bits in the two parts can be determined.

Digital-to-analog converter (DAC) 406 encodes the pre-processed or pre-encoded digital bits (e.g., divided two parts) into voltage pulses of proportional duration). For example, DAC 406 encodes separated digital input bits into analog form as activation pulses or signals. The activation signal produced by the DAC 406 is applied as a voltage pulse of duration $T_{MVM}$ that is equivalent to (c) the input bits to the crossbar array to compute an MVM in analog domain. Crossbar array 408 stores weights, where each weight is encoded as analog conductance using one or several resistive memory devices. The crossbar array 408 generates analog MVM compute or output 410, for example, as described above with reference to FIG. 1. For example, the crossbar array 408 (of resistive memory) generates analog matrix vector multiplication (AMVM) as an analog MVM output. An analog-to-digital converter (ADC) 412 digitizes the analog MVM outputs 410 from the crossbar array 408 into digital output 414. The ADC 412 also uses the speedup factor 416 in producing the digital output 414. For example, the analog MVM output 410 (current out of the crossbar array 408) is digitized by the ADC 412 and multiplied by the speedup factor (SF) 416 used in the pre-encoding and DAC phase, which results in the digital output 414 (i.e., result of the input 402 and matrix (weights stored in the crossbar array 408) multiplication).

Figures 5, 6:
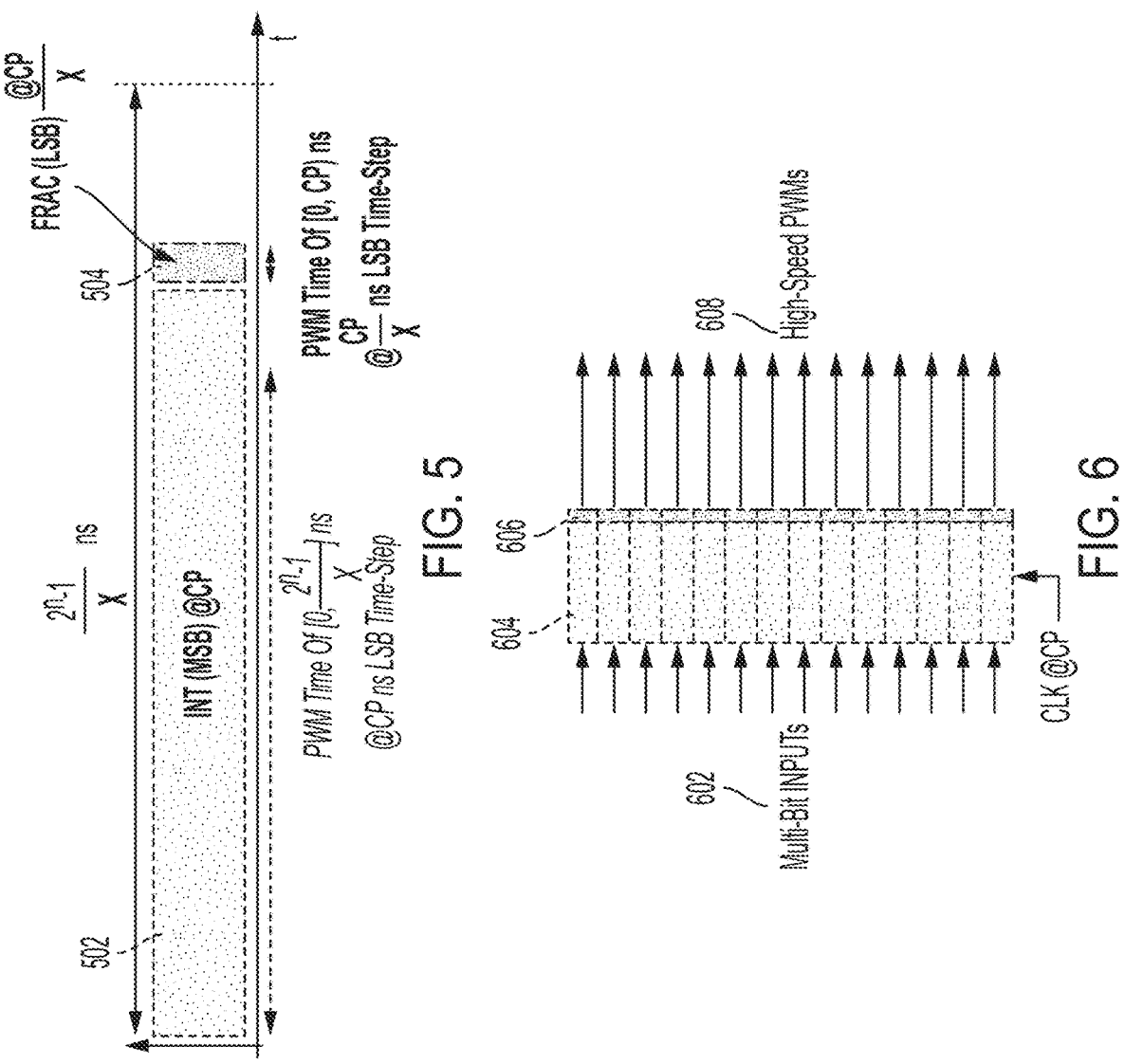
FIG. 5 illustrates an example of pre-encoding an input, where the input bits are divided into two parts in some embodiments for encoding by a digital-to-analog converter (DAC) operating in bit-parallel mode.
FIG. 6 illustrates a digital-to-analog converter (DAC) in some embodiments.

FIG. 5 illustrates an example of pre-encoding an input, where the input bits are divided into two parts in some embodiments for DAC conversion into analog form. As described above input bits are divided into two sub-groups, also known as (a.k.a.) integral part (also referred to as a first part) and fractional part (also referred to as a second part). 't' in the x-axis represents time, e.g., nanoseconds (ns). The integral part generates the most significant bit (MSB time-steps) and the fractional part generates the least significant bit (LSB) time-steps. To encode the integral part into an analog form, the integral part 502 is represented as a time duration corresponding to the value of the integral part using a normal or nominal clock that is available on the chip or processor associated with the DAC. A nominal clock (CLK) speed is referred to as @CLK_PERIOD or @CP. For example, the maximum pulse width modulation time that represents an input is a time duration equal to $(2^n-1)/x$ nanoseconds (ns), where n is a number of bits in the input bits (without the signed bit) and x is the speed factor that is used (e.g., pulse width modulation (PWM) time of $$\left[ 0, \frac{2n-1}{X} \right]$$

ns @CP ns LSB time-step). The fractional part 504 is represented by a delay chain. In some embodiments, the delay chain does not utilize a high speed clock, but is implemented as a simple delay, whose maximum value is the LSB (e.g., @CP/X, or PWM time of [0, CP] ns @CP/X ns LSB time-step).

In general, DAC encodes or converts the first part and the second part into an analog form as an activation pulse having width (or duration) equivalent to magnitude of the first part in time units and a delay of a duration that is a fraction of one time unit of the time units, the fraction being equivalent to magnitude of the second part divided by two raised to power of number of bits in the second part.

FIG. 6 illustrates a digital-to-analog converter (DAC) in some embodiments. Multi-bit inputs at 602 are represented in two parts, where for each input, an integral part 604 is represented using nominal CLK speed and a fractional part 606 is represented by a delay. High-speed pulse width modulations (PWMs) 608 are produced as analog forms of the multi-bit inputs. That is, multi-bit inputs 602 are converted into analog forms 608. For instance, an IN vector 602 is shown as a set of elements, where each element is a multi-bit value. In MVM operations, vector V 602 is converted from digital to analog domain, in this case, into high-speed PWMs 608 in the time domain. High-speed PWMs 608 act as activation inputs to the crossbar.

DAC in some embodiments includes two modifications over original design of nominal 1× pulse width modulation (PWM) speed converting an n-bit integer into a pulse width of time duration. Two supplemental blocks in the fractional part is implemented: one block that includes a (sub-) delay generating block and another block that includes a multiplexer (MUX) that selects one of the delayed outputs. The DAC implementation reduces the number of maximum CLK counts by the same speed factor (SF) as the speed-up is desired. For instance, a 7-bit input (IN) with nominal 1× speed has 127 maximum counts (i.e., $2^7-1$ counts); an SF=2 (2× desired speed) will have 63 counts (i.e., $2^6-1$ counts), an SF=4 (4× desired speed) will have a speed-up of 31 counts (i.e., $2^5-1$ counts), an SF=8 (8× desired speed) will have a speed-up of 15 counts (i.e., $2^4-1$ counts), and so on. A speed-up by a factor of 2 is determined according to the number of bits in the fractional part of the divided input bits. For instance, if a speed-up of 2× is desired, the input bits can be divided where the fractional part has 1 bit and the integral part has the rest of the input bits, i.e., 6 bits (without the signed bit) in input size of 8 bits. If a speed-up of 2× is desired, the input bits can be divided where the fractional part has 1 bit and the integral part has the rest of the input bits, i.e., 6 bits (without the signed bit) in input size of 8 bits.

The DAC reduces the total MVM (TMVM) integration time. For example, the DAC reduces constant static DC energy consumed by the AIMC, while not increasing energy involved in generation of DAC's PWM. The DAC is compact in that no long-wiring is required from an internally generated high-speed CLK source. No circuit component runs at higher external CLK frequency and there is no duplication of CLK (or shifted version of CLK) internally. Low latency allows low temporal variation in pulse-code modulations (PCMs) during a single MVM read.

Figure 7:
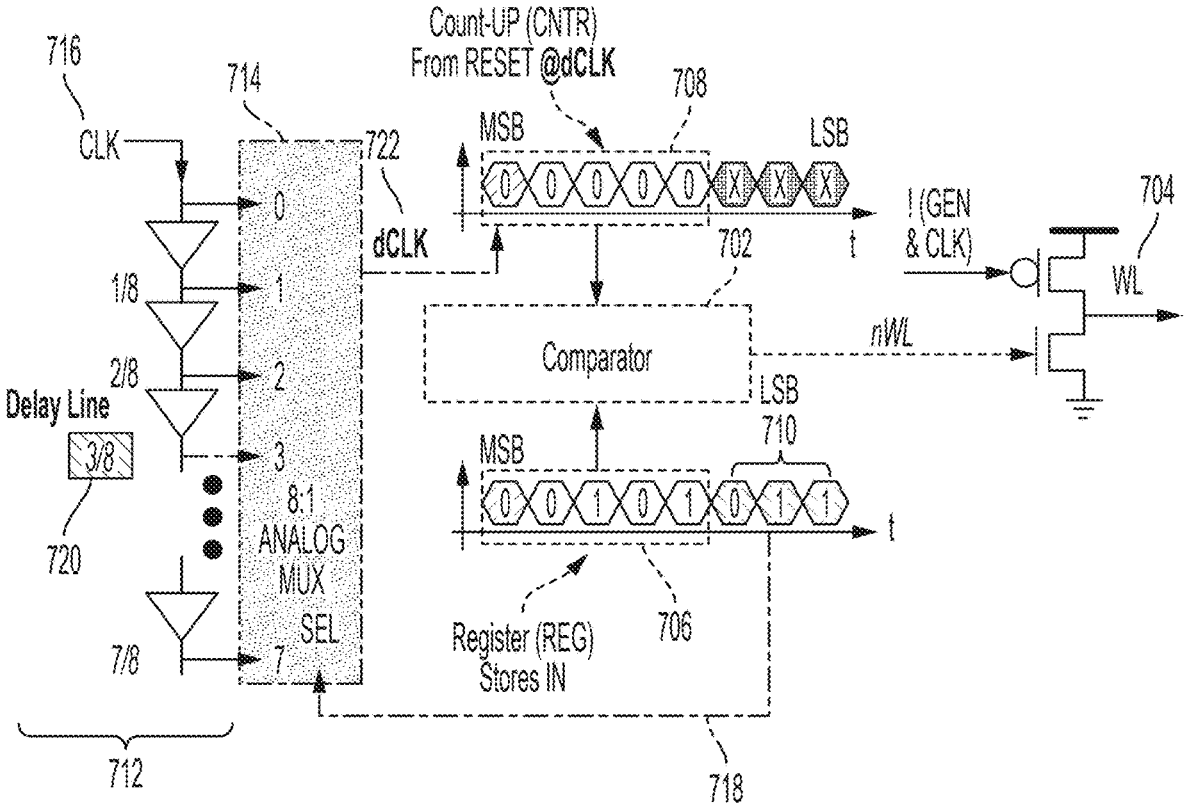
FIG. 7 is a diagram illustrating components of a circuit that implements a digital-to-analog converter (DAC) in some embodiments.
Figure 8:
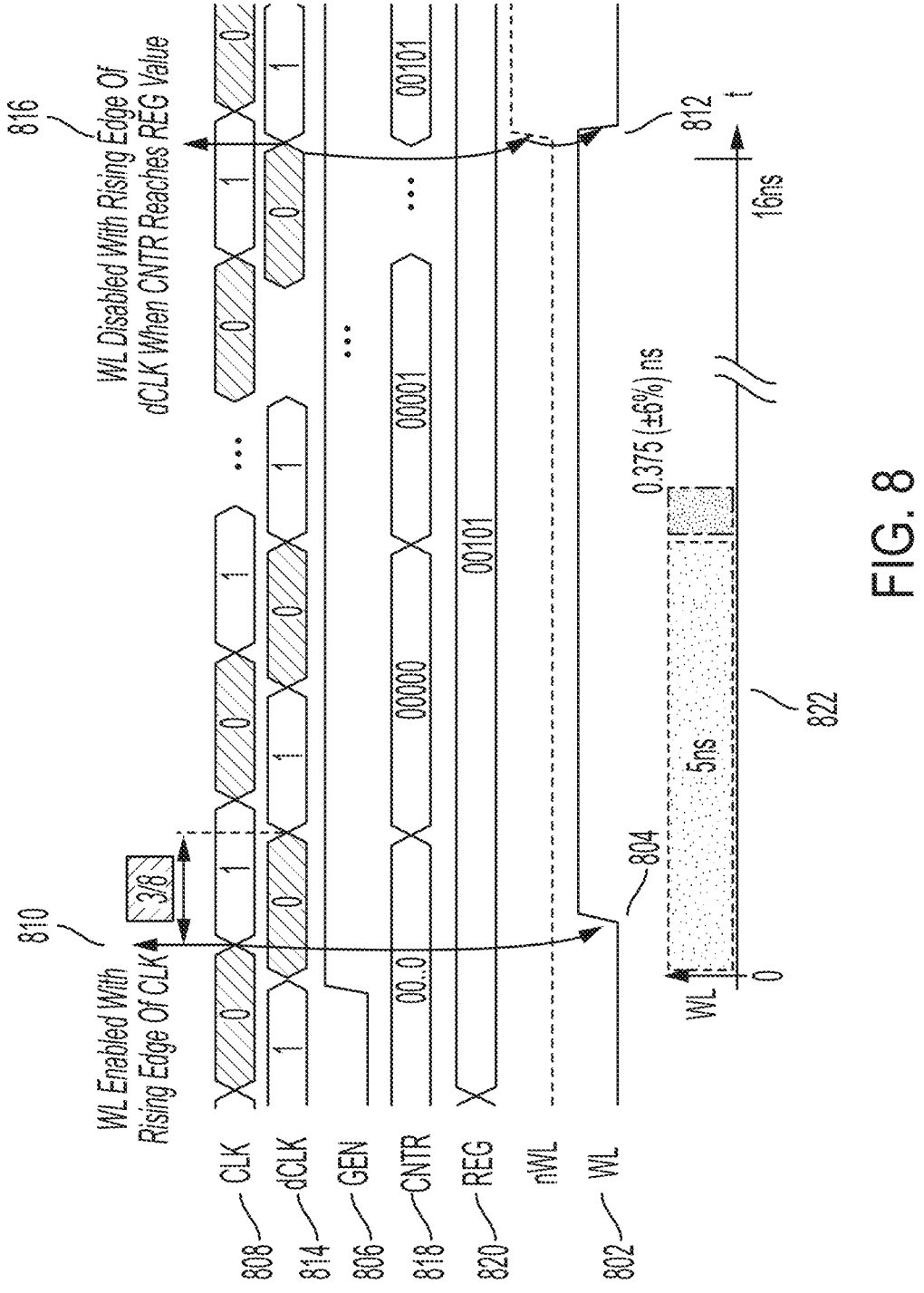
FIG. 8 shows a corresponding timing diagram of various components of a circuit shown in FIG. 7 in some embodiments.

FIG. 7 is a diagram illustrating components of a circuit that implements a digital-to-analog converter (DAC) in some embodiments. Pulse width of a word line (WL) 704 is controlled by a comparator circuit 702. FIG. 8 shows a corresponding timeline of various components of the circuit shown in FIG. 7 in some embodiments. The WL 704 (also shown at 802) is turned ON (rising edge 804) with a global signal GEN (shown at 806) and is synchronized locally with CLK (shown at 808). For example, the WL 802 is enabled with rising edge of CLK 808 as shown at 810. The falling edge 812 of the WL 802 is determined by a comparator circuit 702. Two registers 706, 708 are used. One register 706 stores the input (IN) value and the other 708 increments itself (initially 0) @dCLK speed and counts up. The comparator 702 compares these register values and as the counter register 708 reaches the IN register value, WL 704 is disabled or deactivated. Other comparison methods can be used to compare the values of the two registers for determining the pulse width or duration.

In some embodiments, the integral (INT) part of the input (e.g., also referred to as MSB) is configured as mentioned above, e.g., in register 706. Fractional (FRAC) part 710 (e.g., also referred to as LSB) enables a delay chain 712, where the value of the fractional part decides how much delay is added to the integral part. For example, the fractional part controls the delay chain. In some embodiments, the delay chain 712 implements fractions of a clock (e.g., a period or duration of oscillation between a high and a low state, e.g., 0 and 1) as delays where the denominator of the fractions is a speedup factor. An analog MUX 714 selects an appropriate delay from the delay chain based on the value of the FRAC part that is input to the analog MUX 714, e.g., as shown at 718. Maximum delay is a one clock time or period, the fractional (FRAC) part 710 being represented as a fraction of a clock (e.g., fraction of a nanosecond for 1 GHz (gigahertz) clock speed), which is determined based on the value of the fractional (FRAC) part and the speedup factor. After the selected delay, a delayed version of the CLK 716 (dCLK 722) is used for updating (e.g., counting-up) the CNTR 708.

By way of example, the circuit shown in FIG. 7 and FIG. 8 illustrates using SF=8 (8× speed up). Here, for a FRAC value of '011' 710, an analog MUX 714 selects 3/* (shown at 720) delayed version of the CLK (shown at 722) in the pull-down part of the WL driver. Hence, a delay of INT part+FRAC part is achieved. In some embodiments, delay clock (dCLK) operates (or is implemented) as follows; i) internal CLK 716 is the input to the delay chain 712, thereby, generating different phases or delayed versions of the CLK, ii) During the MVM operation, one of these delayed versions is selected via the FRACTIONAL bits 710, whereby, these bits act as enable signals of one of the analog MUX in the 8:1 analog MUX block 714. This selected delayed version of the CLK is denoted as dCLK 722. iii) this dCLK 722 triggers and acts as a clock signal for the CNTR 708 to count up. This is also shown in FIG. 8. With rising edge (shown at 810) of CLK 808, WL 802 is enabled as shown at 804. After a MUX selected delay (e.g., ⅜ of CLK), counter (CNTR) 818, (also shown in FIG. 7 at 708) starts counting up from a reset value of 0, synchronized to dCLK 814 (also shown at 722 in FIG. 7). Each dCLK time adds one to the counter. When the count in the CNTR 818 reaches (e.g., becomes equal to) the value of the INT part or value of register (REG) 820 (also shown at 706 in FIG. 7) that stores the INT part, WL 802 is disabled, for example, as shown at 812. That is WL 802 is disabled with rising edge of dCLK 814 as shown at 816, when the CNTR 818 reaches the value of register (REG) 820. In this example, the value of input is represented as a duration of 5 ns (with 8× speedup) and 0.375 ns (⅜ of CLK), e.g., as shown at 822. Different implementations can be contemplated. For instance, in another embodiment, CNTR 708 can be initialized with the value of the INT part in 706, where at each dCLK time, CNTR 708 can be decremented by one. In this embodiment, WL 704 is disabled responsive to CNTR 708 reaching the value of zero as a result of the decrements.

In some embodiments, an error in the data representation due to device voltage variations or temperature fluctuations can be contained, for example, within an element of a delay chain. Hence, such an error, if any, can be minimized. Experiments show that any variation in data representation experienced due to a delay chain can be minimized to 6% of the fractional part of the input, which only impacts only a small part of the overall value of the input. Hence, the device and method described herein can maintain accuracy of data representation.

Figure 9:
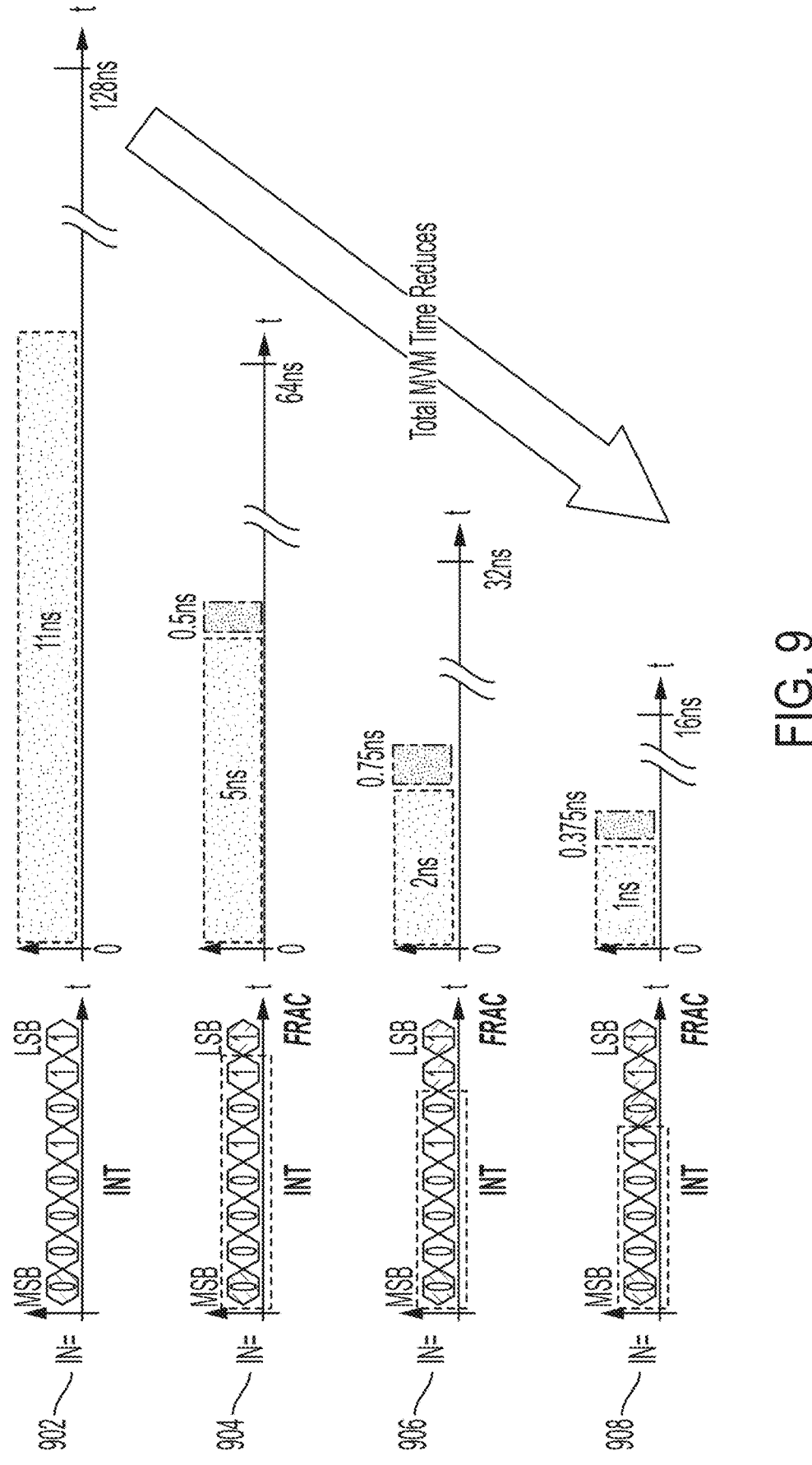
FIG. 9 illustrates examples of speedup factors, implemented based on number of input bits divided into integral and fractional parts, in some embodiments.

FIG. 9 illustrates examples of speedup factors, implemented based on number of input bits divided into integral and fractional parts, in some embodiments. In some embodiments, INT or integral part is an integral multiple of 1 nanosecond (ns), generated using 1 GHz external clock (CLK). FRAC or fractional part is a fractional part of 1 nanosecond (ns), generated, in some embodiments by way of example, via an analog delay chain (e.g., shown in FIG. 7 at 712) and use of a multiplex (MUX) (e.g., shown in FIG. 7 at 714). Consider by way of example that input bits (IN) have 8 bits of data with 1 bit representing a signed bit (negative or positive) and the 7 bits representing an input value. The example shows an input value of decimal '11' or binary '0001011'. At 902, the example shows no speedup, that is, 7 bits of the input bits (without the signed bit) are represented within a maximum duration of 128 nanoseconds, e.g., as 11 ns.

At 904, a speedup factor of 2 is used, by segmenting or dividing the input bits into 1 bit of FRAC (LSB) part and 6 bits of INT part. The maximum duration used in this representation is 64 nanoseconds (corresponding to $2^6$, where the exponent ('6') is the number of bits in INT part), with the INT part represented as 5 nanoseconds (corresponding to binary '000101' of the INT part) and 0.5 nanoseconds representing a delay (½ ns corresponding to binary '1' of the FRAC part, where the numerator of '½' ns represents the value of the FRAC part and the denominator represents the speedup factor).

Likewise at 906, a speedup factor of 4 is used, by segmenting or dividing the input bits into 2 bits of FRAC (LSB) part and 5 bits of INT part. The maximum duration used in this representation is 32 nanoseconds (corresponding to $2^{\wedge}5$, where the exponent ('5') is the number of bits in INT part), with the INT part represented as 2 nanoseconds (corresponding to binary '00010' of the INT part) and 0.75 nanoseconds representing a delay (¾ ns corresponding to binary '11' of the FRAC part, where the numerator in '¾' ns represents the value of the FRAC part and the denominator represents the speedup factor).

Similarly, at 908, a speedup factor of 8 is used, by segmenting or dividing the input bits into 3 bits of FRAC (LSB) part and 4 bits of INT part. The maximum duration used in this representation is 16 nanoseconds (corresponding to $2^{\wedge}4$, where the exponent ('4') is the number of bits in INT part), with the INT part represented as 1 nanoseconds (corresponding to binary '0001' of the INT part) and 0.375 nanoseconds representing a delay (⅜ ns corresponding to binary '011' of the FRAC part, where the numerator in '⅜' ns represents the value of the FRAC part and the denominator represents the speedup factor).

As shown, the total matrix vector multiplication time, e.g., performed in a crossbar array, is reduced by representing input bit values in bit-parallel method of digital-to-analog conversion using a speedup factor. In some embodiments, as described herein, speedup is implemented by segmenting the input bits into two parts and implementing a delay chain for representing one part. Depending on the capability of an DACs and ADCs used, any desired speed up may be implemented.

Figure 10:
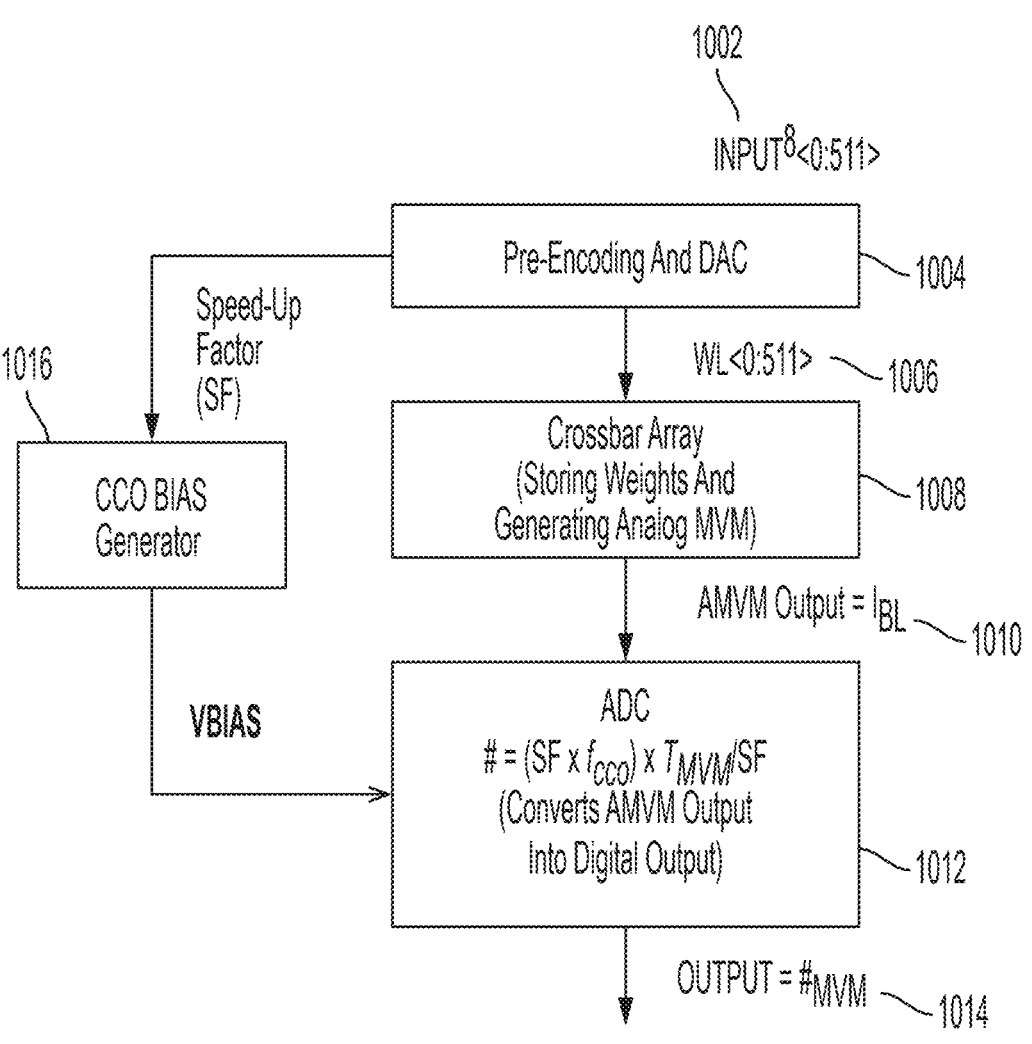
FIG. 10 is a block diagram illustrating a process flow and device components that perform analog MVM (AMVM) in some embodiments.

FIG. 10 is a block diagram illustrating a process flow and device components that perform analog MVM (AMVM) in some embodiments. As described above, in some embodiments, a device and/or method realizes at 1004 pre-encoding of 512 8-bit inputs ($INPUT^8<0{:}511>$) 1002 into INT+FRAC parts and converting of these parts in an analog value in the time domain as WL<0:511>1006. For example, at 1004, a pre-encoding unit or processor and a DAC as described above pre-encodes the input into two parts and converts the two parts into an analog value represented as a pulse width of time duration, e.g., a word line 1006. These analog values 1006 converted by DAC are fed into a crossbar array 1007 to perform AMVM with original $T_{MVM}$ (in the non-speedup case) reduced by the speedup factor. For example, the speedup factor can be 8× (8 times the original or nominal speed). Other speedup factors can be configured. The crossbar array produces AMVM output 1010.

ADC 1012 converts the AMVM output 1010 into a digital output 1014. The ADC 1012 converting the AMVM output 1010 takes into consideration the speedup factor. In a current controlled oscillator (CCO)-based ADC, the speedup factor can be incorporated using a VBIAS to a CCO circuit to increase the frequency of oscillations. This implies that for the same $I_{BL}$ generating $f_{CCO}$ frequency of oscillations, where $f_{CCO}=f(I_{BL})$, in a non-speedup case, the CCO oscillates at $f_{CCO}$ frequency in $T_{MVM}$ time duration, generating $\#_{MVM}$ counts. $I_{BL}$ refers to current from a column of a crossbar array. In an 8× speedup case, the CCO oscillates at $8^*f_{CCO}$ frequency for $\frac{1}{8}{}^*T_{MVM}$ time duration, generating $\#_{MVM}$ counts. The CCO BIAS generator 1016 generates a one-time calibrated value set at the calibration stage when the speedup factor is decided before the MVM operation. For example, CCO block includes two parts: a controlled oscillator and a biasing circuit receiving input voltage. The input voltage is proportional to the input current that is to be digitized. The biasing circuit, either a set of configurable header devices or a set of configurable footer devices, sits on top or bottom of the controlled oscillator block, respectively. These biasing circuits can be configured to provide a scaled version of the input current via tuning the strength of the header (or footer block). The strength can be tuned by selecting one or several configurable number of header (or footer) devices. In this way, an arbitrary speed-up (SF) can be accommodated.

Figure 11:
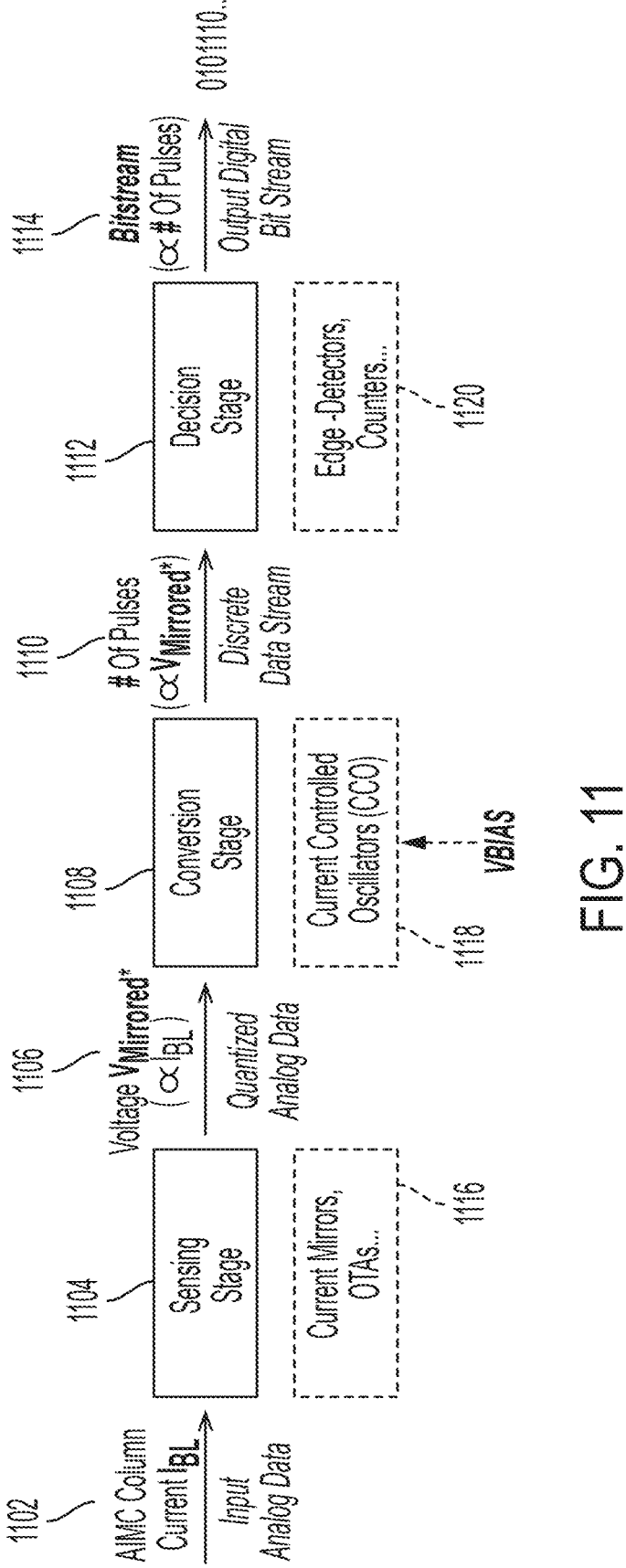
FIG. 11 is a block diagram illustrating a current controlled oscillator (CCO)-based analog-to-digital converter (ADC) in some embodiments.

FIG. 11 is a block diagram illustrating a current controlled oscillator (CCO)-based analog-to-digital converter (ADC) in some embodiments. In this implementation, in some embodiments, a speedup factor, 8× shown by way of example, can be incorporated using a VBIAS to a CCO circuit to increase the frequency of oscillations. For example, ADC1 110a and/or ADC2 110b shown in FIG. 1, and/or ADC 412 shown in FIG. 4 can use the ADC implementation shown in FIG. 11.

As described above with reference to FIG. 3, an ADC can include three stages, where each stage ensures linear input/output (I/O) characteristics (linear relation between ideal MVM value and its corresponding digital ADC output). Input to the ADC is a current (also shown as $I_{BL}$) 1102, an analog data, for example, from a column of a crossbar array (e.g., see FIG. 1 at 110a). This input is received at sensing stage 1104 of the ADC. In this stage, the ADC changes the current output from the crossbar array (input to the sensing stage of the ADC) into a voltage value equivalent to the input current as shown at 1106. This sub-block 1102 ensures linear value reaching the ADC as analog input ($I_{BL}$) is equivalent to the analog MVM value. In current-based ADCs, this sub-block 1102 includes current mirrors, operational transconductance amplifiers (OTAs), or others 1116, and provides intermediate analog workable conversion to the next stage.

Conversion stage 1108 of the ADC converts the intermediate analog value 1106 to discrete quantities 1110 that is then fed into the last stage. For example, the voltage value 1106 from the sensing stage 1104 is provided to a current-controlled oscillator (CCO) 1118 in the conversion stage 1108, which oscillates according to the voltage value. If the voltage value is high, the CCO oscillates at higher speed, and therefore, more pulses are present. In some embodiments, VBIAS is applied to the CCO 1118 to increase the frequency of oscillations according to the speedup factor, e.g., by SF=8 illustrated by way of example. As described above, e.g., in an 8× speedup case, the CCO 1118 oscillates at $8^*f_{CCO}$ frequency for $\frac{1}{8}{}^*T_{MVM}$ time duration, generating $\#_{MVM}$ counts. Generally, the CCO 1118 oscillates at $SF^*f_{CCO}$ frequency for $1/SF^*T_{MVM}$ time duration, where SF=speedup factor.

Conversion stage 1108 also includes compensation blocks to address any non-linearities of this block. In current-based ADCs, this sub-block 1108 includes current-controlled oscillator (CCO) 1118 which receives the mirrored current 1106 from the sensing stage 1104 and generates spikes or pulses equivalent to $I_{BL}$. Decision stage 1112 of the ADC counts the number of pulses generated by the CCO 1118 as digital outputs 1114. Decision stage 1112 may include edge-detectors, counters, and/or other devices that can count or detect counts.

In embodiments where the ADC is not counter-based, the digital output from such ADC can be multiplied by the speedup factor. A light-weight processor or the like may be used to multiply the digital output by the speedup factor in such embodiments.

Figure 12:
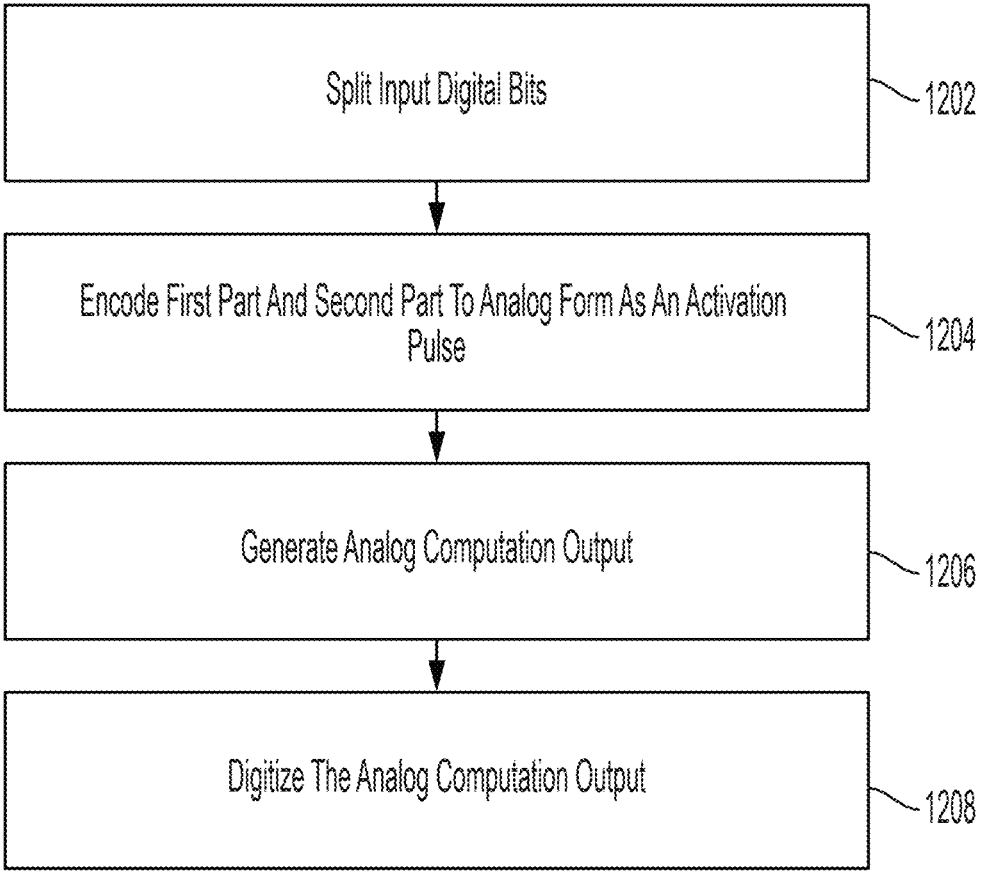
FIG. 12 is a flow diagram illustrating a method of performing computation using a crossbar array of resistive memory devices in some embodiments.

FIG. 12 is a flow diagram illustrating a method in some embodiments. The method reduces latency in bit-parallel scheme of digital-to-analog conversions. At 1202, input digital bits, for example, received for conversion into analog form for applying to a crossbar array of resistive memory devices for computation, is split into a first part and a second part. As shown in FIG. 4, a pre-processing stage to a digital-to-analog conversion can perform this splitting. Different ways of splitting the input digital bits are shown in FIG. 9, by way of example. The number of bits for the first part into which the input digital bits are split is configurable. The number of bits for the second part into which the input digital bits are split is configurable. A speedup factor that increases speed at which the crossbar array performs computation is proportional to the number of bits in the second part. For example, based on a desired speed increase for performing computation in the crossbar array, number of bits for the second part can be selected.

At 1204, a digital-to-analog converter (DAC) encodes the first part and the second part into analog form as an activation pulse having width (e.g., duration width) equivalent to the magnitude of the first part in time units and a delay of a duration that is a fraction of one time unit of the time units. The fraction is equivalent to the magnitude of the second part divided by two raised to power of number of bits in the second part. FIG. 5, by way of example, shows an example analog form as an activation pulse with time width. An activation pulse is characterized by a rising edge and a falling edge of voltage (or current). For example, FIG. 8 at 804 and 812 show a WL's activation pulse, which is characterized by a rising edge 804 and a falling edge 812. In some embodiments, the time unit is a clock cycle time of a clock used on the device. In some embodiments, the time unit is a nanosecond where the clock speed of a clock used on the device is 1 gigahertz (GHz). In some embodiments, the activation pulse is a voltage pulse.

In some embodiments, the DAC encodes the first part and the second part into analog form using a delay chain coupled with a multiplexer. By way of example, a delay chain and a multiplexer is shown in FIG. 7. The multiplexer select an appropriate delay in the delay chain based on the magnitude of the second part, responsive to which (e.g., after that delay duration), a local delay clock is triggered to begin counting the clock time up to the magnitude of the first part.

At 1206, a crossbar array storing weights as analog conductance on resistive memory devices generates analog computation output, responsive to the analog form of the input digital bits applied to the crossbar array. By way of example, FIG. 1 shows a crossbar array. In some embodiments, the analog computation output is an analog matrix-vector-multiplication output.

At 1208, an analog-to-digital converter (ADC) digitizes the analog computation output from the crossbar array. An example of an ADC is shown in FIG. 3 and FIG. 11. Digitizing also includes multiplying the analog computation output from the crossbar array by a speed factor that is equivalent to two raised to power of number of bits in the second part.

In some embodiments, a system and/or method disclosed herein provides for high-speed pulse-width modulator to perform in-memory matrix multiplication. The system and/or method spits input (magnitude bits of a multi-bit digital input) into INT part and FRAC part, i.e., a set of higher significant bits as INT part and a set of lower significant bits (remaining bits) as FRAC part. A pre-processing stage of digital-to-analog conversion may perform the splitting. Different designs for splitting can be implemented, e.g., the number of bits in the INT and FRAC parts can be configured based on the technology, ADC design, and/or others for configurable MVM read time and accuracy. The system and/or method generate a time duration corresponding to the INT part using the nominal clock frequency, and generate an additional time duration corresponding to the FRAC part (added in continuation with the INT part's time duration) using locally generated time duration with a simple delay chain. Analog in-memory computing (AIMC) with multi-bit inputs is performed in a single phase. Adding the FRAC related time duration in continuation of INT related duration allows for one-phase read. One-phase read allows for eliminating the need of using scaling during the post-processing of ADC outputs. Hence, the system and/or method eliminate not only the quantization errors due to multiple phase reads but also amplification of these errors with scaling. The system and/or method allows for smaller duration when digital to analog (time) conversion is performed. MVM operation can be accelerated with lower energy. In some embodiments, the system and/or method use only the FRAC part to be generated by such a delay, which in turn impacts negligibly to the overall accuracy on the generated pulse.

The system and/or method in some embodiments present a high-speed and low-power solution to convert digital inputs into analog outputs (in terms of time quantity) for efficient analog in-memory computing (AIMC) systems. In some embodiments, no external high frequency clock needs to be utilized as a reference clock to a DTC component or within each DTC component. In some embodiments, the system and/or method results in, or provides for, a high speed DTC, speed up by a factor equal to $2^{n(FRAC)}$ (where, n(FRAC) is the number of bits in the FRAC part). In some embodiments, the system and/or method results in, or provides for, a low power solution, since the system and/or method do not involve or utilize high frequency clock generation in any circuit component or high speed clock routing. In some embodiments, the system and/or method results in, or provides for, an accurate DTC, since the variation prone part generating smaller unit time delay, i.e., time duration corresponding to the FRAC part has negligible impact on the overall resulting time duration compared to state-of-the-art solutions. The system and/or method also can perform AIMC with multi-bit inputs in a single phase.

The terminology used herein is for the purpose of describing particular embodiments only and is not intended to be limiting of the invention. As used herein, the singular forms "a", "an" and "the" are intended to include the plural forms as well, unless the context clearly indicates otherwise. As used herein, the term "or" is an inclusive operator and can mean "and/or", unless the context explicitly or clearly indicates otherwise. It will be further understood that the terms "comprise", "comprises", "comprising", "include", "includes", "including", and/or "having," when used herein, can specify the presence of stated features, integers, steps, operations, elements, and/or components, but do not preclude the presence or addition of one or more other features, integers, steps, operations, elements, components, and/or groups thereof. As used herein, the phrase "in some embodiments" does not necessarily refer to the same embodiment, although it may. As used herein, the phrase "in one embodiment" does not necessarily refer to the same embodiment, although it may. As used herein, the phrase "in another embodiment" does not necessarily refer to a different embodiment, although it may. Further, embodiments and/or components of embodiments can be freely combined with each other unless they are mutually exclusive.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A device comprising:
a processor configured to split input digital bits into a first part and a second part;
a digital-to-analog converter (DAC) coupled with the processor, and configured to encode the first part and the second part into analog form as an activation pulse having width equivalent to magnitude of the first part in time units and a delay of a duration that is a fraction of one time unit of the time units, the fraction being equivalent to magnitude of the second part divided by two raised to power of number of bits in the second part;
a crossbar array coupled with the DAC, and structured with resistive memory devices, the crossbar array configured to store weights, wherein each of the weights is encoded as analog conductance using at least one of the resistive memory devices, the crossbar array configured to generate analog computation output responsive to the analog form of the input digital bits applied to the crossbar array; and
an analog-to-digital converter (ADC) coupled with the crossbar array, and configured to digitize the analog computation output from the crossbar array.

2. The device of claim 1, wherein the time unit is a clock cycle time of a clock used on the device.

3. The device of claim 1, wherein the time unit is a nanosecond and clock speed of a clock used on the device is 1 gigahertz (GHz).

4. The device of claim 1, wherein number of bits for the first part into which the input digital bits are split is configurable.

5. The device of claim 1, wherein number of bits for the second part into which the input digital bits are split is configurable.

6. The device of claim 1, wherein a speedup factor that increases speed at which the crossbar array performs computation is proportional to the number of bits in the second part.

7. The device of claim 1, wherein the DAC includes a delay chain coupled with a multiplexer that is configured to select the delay based on the magnitude of the second part, the DAC further configured to trigger a local delay clock responsive to the multiplexer selecting the delay based on the magnitude of the second part.

8. The device of claim 1, wherein the activation pulse is a voltage pulse.

9. The device of claim 1, wherein the ADC is configured to multiply output from the crossbar array by a speed factor that is equivalent to two raised to power of number of bits in the second part.

10. The device of claim 1, wherein the analog computation output is an analog matrix-vector-multiplication output.

11. A method comprising:
splitting input digital bits into a first part and a second part;
encoding, by a digital-to-analog converter (DAC), the first part and the second part into analog form as an activation pulse having width equivalent to magnitude of the first part in time units and a delay of a duration that is a fraction of one time unit of the time units, the fraction being equivalent to magnitude of the second part divided by two raised to power of number of bits in the second part;
generating, by a crossbar array storing weights as analog conductance on resistive memory devices, analog computation output, responsive to the analog form of the input digital bits applied to the crossbar array; and
digitizing, by an analog-to-digital converter (ADC), the analog computation output from the crossbar array.

12. The method of claim 11, wherein the time unit is a clock cycle time of a clock used on the device.

13. The method of claim 11, wherein the time unit is a nanosecond and clock speed of a clock used on the device is 1 gigahertz (GHz).

14. The method of claim 11, wherein number of bits for the first part into which the input digital bits are split is configurable.

15. The method of claim 11, wherein number of bits for the second part into which the input digital bits are split is configurable.

16. The method of claim 11, wherein a speedup factor that increases speed at which the crossbar array performs computation is proportional to the number of bits in the second part.

17. The method of claim 11, wherein the encoding includes using a delay chain coupled with a multiplexer and triggering a local delay clock responsive to the multiplexer selecting the delay based on the magnitude of the second part.

18. The method of claim 11, wherein the activation pulse is a voltage pulse.

19. The method of claim 11, wherein the digitizing includes multiplying the analog computation output from the crossbar array by a speed factor that is equivalent to two raised to power of number of bits in the second part.

20. The method of claim 11, wherein the analog computation output is an analog matrix-vector-multiplication output.

* * * * *